US009206992B2

(12) United States Patent
Ellwanger

(10) Patent No.: US 9,206,992 B2
(45) Date of Patent: Dec. 8, 2015

(54) STORAGE CONFIGURATION WITH PREDETERMINABLE STORAGE ATMOSPHERE

(75) Inventor: Harald Ellwanger, Neuenstadt (DE)

(73) Assignee: Hänel & Co., Altstätten (CH)

( * ) Notice: Subject to any disclaimer, the term of this patent is extended or adjusted under 35 U.S.C. 154(b) by 664 days.

(21) Appl. No.: 12/680,944

(22) PCT Filed: Oct. 22, 2008

(86) PCT No.: PCT/EP2008/064266
§ 371 (c)(1),
(2), (4) Date: Mar. 31, 2010

(87) PCT Pub. No.: WO2009/053380
PCT Pub. Date: Apr. 30, 2009

(65) Prior Publication Data
US 2010/0221993 A1 Sep. 2, 2010

(30) Foreign Application Priority Data
Oct. 25, 2007 (DE) .......................... 10 2007 051 726

(51) Int. Cl.
*B01L 1/04* (2006.01)
*F24F 3/16* (2006.01)
*B60H 1/32* (2006.01)
*B65G 1/127* (2006.01)
*H01L 21/677* (2006.01)

(52) U.S. Cl.
CPC ......... *F24F 3/1607* (2013.01); *H01L 21/67769* (2013.01)

(58) Field of Classification Search
None
See application file for complete search history.

(56) References Cited

U.S. PATENT DOCUMENTS 3,087,648 A * 4/1963 Cope ................................ 221/81
3,134,243 A * 5/1964 Hagen et al. ................... 62/256
(Continued)

FOREIGN PATENT DOCUMENTS

DE 2124867 A 12/1972
DE 20311833 U1 10/2003
(Continued)

OTHER PUBLICATIONS

Patent Cooperative Treaty, PCT/EP2008/064266, International Preliminary Report and Written Opinion of the International Searching Authority, dated May 20, 2010, 6 pages.
(Continued)

*Primary Examiner* — Gregory Huson
*Assistant Examiner* — Eric Gorman
(74) *Attorney, Agent, or Firm* — Thomas B. Ryan; Harter Secrest & Emery LLP

(57) ABSTRACT

The invention relates to a storage configuration having a predeterminable storage atmosphere, comprising a storage chamber for receiving a plurality of storage product carriers for storage product, which can be delivered to a feeding and removal opening for the storage and removal of the storage product using a transport apparatus, and further comprising an air-conditioning apparatus, which associated with the storage chamber and exhausts air from the storage chamber, treats it, and injects it back into the storage chamber via exhaust and injection openings provided on the storage chamber. The exhaust and injection openings are disposed such that the air flows through the storage chamber in the vertical direction.

22 Claims, 3 Drawing Sheets

(56) References Cited

U.S. PATENT DOCUMENTS

| | | | | |
|---|---|---|---|---|
| 3,546,893 A * | 12/1970 | Frudeger | | 62/89 |
| 3,648,662 A * | 3/1972 | Lines | | 119/71 |
| 3,835,760 A * | 9/1974 | Rekesius | | A47J 37/045 |
| | | | | 126/41 C |
| 4,003,728 A * | 1/1977 | Rath | | 62/78 |
| 4,145,893 A * | 3/1979 | Vogel | | 62/151 |
| 4,369,632 A * | 1/1983 | Abraham | | A47F 3/0408 |
| | | | | 62/256 |
| RE32,113 E * | 4/1986 | Harr | | 119/419 |
| 4,666,477 A * | 5/1987 | Lough | | 96/381 |
| 4,701,096 A * | 10/1987 | Fisher, Jr. | | 414/416.08 |
| 4,778,382 A * | 10/1988 | Sakashita | | 432/239 |
| 4,867,629 A * | 9/1989 | Iwasawa et al. | | 414/331.05 |
| 4,880,581 A * | 11/1989 | Dastoli et al. | | 264/39 |
| 4,927,438 A * | 5/1990 | Mears et al. | | 55/385.2 |
| 4,976,815 A * | 12/1990 | Hiratsuka et al. | | 156/345.11 |
| 5,009,080 A * | 4/1991 | Naganuma | | A47F 3/0404 |
| | | | | 454/193 |
| 5,064,337 A * | 11/1991 | Asakawa et al. | | 414/639 |
| 5,291,746 A * | 3/1994 | Abbott | | 62/89 |
| 5,363,867 A * | 11/1994 | Kawano et al. | | 134/95.2 |
| 5,401,212 A * | 3/1995 | Marvell et al. | | 454/187 |
| 5,413,527 A * | 5/1995 | Dansui et al. | | 454/57 |
| 5,466,109 A * | 11/1995 | Iizuka | | 414/283 |
| 5,527,390 A * | 6/1996 | Ono et al. | | 118/719 |
| 5,562,383 A * | 10/1996 | Iwai et al. | | 414/217.1 |
| 5,679,059 A * | 10/1997 | Nishi et al. | | 451/41 |
| 5,704,224 A * | 1/1998 | Choi | | 62/407 |
| 5,827,118 A * | 10/1998 | Johnson et al. | | 454/187 |
| 5,853,486 A * | 12/1998 | Ono et al. | | 118/719 |
| 5,875,642 A * | 3/1999 | Lee et al. | | 62/256 |
| 5,937,223 A * | 8/1999 | Akimoto et al. | | 396/604 |
| 5,944,602 A * | 8/1999 | Grundy | | 454/187 |
| 5,997,398 A * | 12/1999 | Yamada et al. | | 454/187 |
| 6,059,196 A * | 5/2000 | Miyazaki et al. | | 236/44 A |
| 6,238,814 B1 * | 5/2001 | Horiguchi et al. | | 429/458 |
| 6,405,644 B1 * | 6/2002 | Windecker | | 99/468 |
| 6,431,060 B1 * | 8/2002 | Gutheim | | 99/475 |
| 6,682,414 B2 * | 1/2004 | Nakao | | 454/187 |
| 6,758,876 B2 * | 7/2004 | Suzuki et al. | | 55/385.6 |
| 7,682,123 B2 * | 3/2010 | Bachrach | | 414/416.03 |
| 8,118,530 B2 * | 2/2012 | Ikehata | | 414/217 |
| 8,172,347 B2 * | 5/2012 | Lim et al. | | 312/408 |
| 2001/0003702 A1 * | 6/2001 | Livchak | | A47F 3/0447 |
| | | | | 454/193 |
| 2001/0037764 A1 * | 11/2001 | Nakashima et al. | | 118/70 |
| 2002/0023458 A1 * | 2/2002 | Sakata et al. | | 62/378 |
| 2003/0050005 A1 * | 3/2003 | Nakao | | 454/187 |
| 2003/0091728 A1 * | 5/2003 | Ueda | | 427/58 |
| 2005/0053891 A1 * | 3/2005 | Mochizuki et al. | | 432/250 |
| 2006/0096312 A1 * | 5/2006 | Shim | | 62/419 |
| 2006/0199495 A1 * | 9/2006 | Yamaguchi | | 454/173 |
| 2006/0199497 A1 * | 9/2006 | Smith et al. | | 454/173 |
| 2008/0089765 A1 * | 4/2008 | Moriya et al. | | 414/416.03 |
| 2008/0237167 A1 * | 10/2008 | Hanel | | A47B 57/10 |
| | | | | 211/183 |
| 2012/0052203 A1 * | 3/2012 | Miyashita et al. | | 427/248.1 |

FOREIGN PATENT DOCUMENTS

| | | |
|---|---|---|
| DE | 102004014937 A1 | 10/2005 |
| DE | 102004043225 A1 | 3/2006 |
| EP | 0040676 A2 | 12/1981 |
| JP | 10291607 A | 11/1998 |
| JP | 2000264405 A | 9/2000 |
| WO | 9417336 A | 8/1994 |
| WO | 2006121255 A2 | 11/2006 |

OTHER PUBLICATIONS

PCT/EP2008/964266 International Search Report dated Feb. 15, 2009, 6 pages.

* cited by examiner

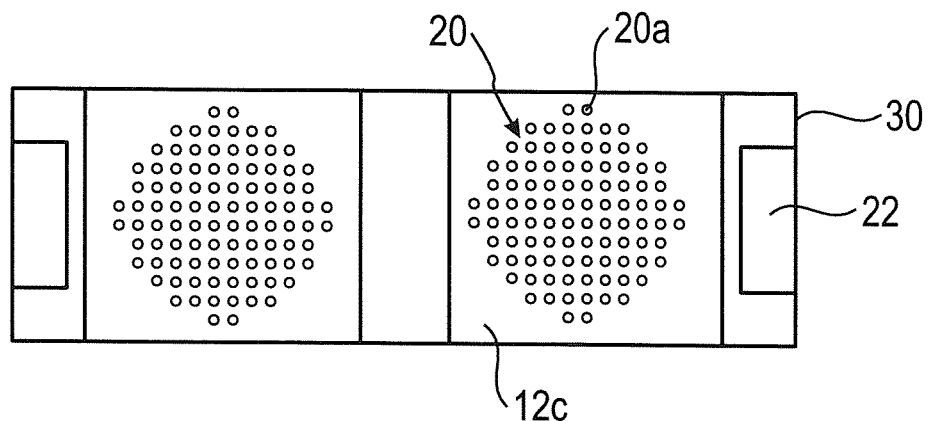
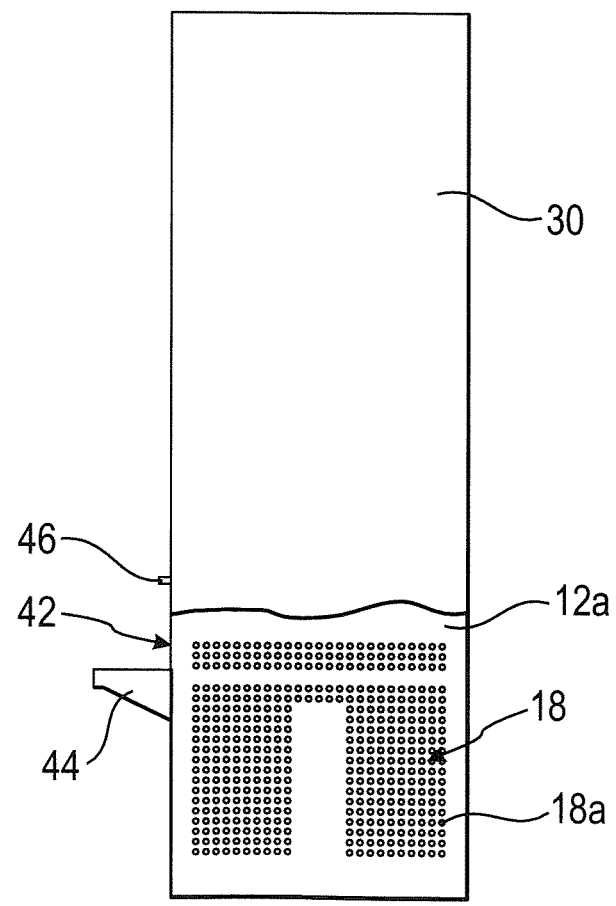

STORAGE CONFIGURATION WITH PREDETERMINABLE STORAGE ATMOSPHERE

The present invention relates to a storage configuration with a predeterminable storage atmosphere, comprising a storage chamber to accommodate a plurality of storage product carriers for storage product, which can be delivered to a feeding and removal opening for the storage and removal of the storage product using a transport apparatus, and further comprising a conditioning apparatus, which is associated with the storage chamber and extracts air from the storage chamber, treats it, and injects it back into the storage chamber via extraction and injection openings provided on the storage chamber.

Storage configurations of the initially mentioned type are used to store storage product particularly sensitive to environmental conditions. Examples of such storage product are perishable objects, which must be stored in a cool place, for example, or semiconductor products which must be stored in a dust-protected environment while they are in a half-finished state.

Storage configurations for this purpose are known from the prior art.

DE 10 2004 014 937 A1 shows a storage configuration with a predetermined storage atmosphere wherein air ducts are arranged on two side walls of a storage chamber. A separating wall is present between the air ducts and the storage chamber and has openings of various sizes. One of the ducts acts as an intake duct and the other as an exhaust duct. The ducts are connected to a conditioning apparatus arranged above the ceiling of the storage chamber in such a manner that the air from the exhaust duct is treated in the conditioning apparatus and then reinjected into the storage chamber via the intake duct and the openings in the separating wall to the storage chamber.

JP 10-291607 A also shows a storage chamber wherein continuous ventilation with air, which has predetermined properties, should be insured by means of a conditioning apparatus. The storage chamber is subdivided into storage surfaces having an open side toward the outside of the storage chamber and to intake air ducts, wherein the storage surfaces are open toward the center of the storage chamber. The conditioned air is injected into the storage chamber from the sides and extracted from the bottom region in the center of the storage chamber.

In the above-mentioned storage configurations, air flows through the storage chamber in the horizontal direction.

The present invention is based on the object to provide a storage configuration of the initially mentioned type, which has improved clean room capability while remaining simple in construction.

To achieve this object in a storage configuration of the initially mentioned type, it is suggested to arrange the extraction and injection openings in such a manner that the air flows through the storage chamber in the vertical direction.

The storage configuration of the present invention has the advantage that by guiding air in the vertical direction, particulate deposited on horizontal surfaces in the storage chamber is not or is only very slightly swirled up by the airflow. By these means the particle density in the air in the storage chamber is reduced which leads to improved clean room properties.

Advantageous embodiments of the invention are the subject matter of the dependent claims.

Advantageously, the injection opening is arranged in a ceiling section, and the extraction opening is arranged in a bottom section. This has the advantage that particles, even if carried along by the airflow, successively drift toward the bottom under the force of gravity and thus collect on the bottom or in the extracted air and can thus be more easily removed from the storage chamber. This results in a further improved clean room capability of the storage configuration.

The injection opening and/or the extraction opening can be formed as a perforated metal sheet. This is more advantageous from a structural point of view than to provide large openings and it has hardly any negative effects on the airflow.

Advantageously, the extraction opening is provided in the lower region of the side walls of the storage chamber. By these means, substructures, which would be made necessary by an extraction duct arranged below the storage chamber are avoided and thus the storage chamber can be more easily supported on any existing ground surface.

Advantageously, storage product carriers are permeable to air. This essentially contributes to the vertical airflow being able to pass the storage chamber in an unobstructed manner.

The bottom of the storage product carriers can thus have openings through which the air can flow.

Advantageously, the bottoms of the storage product carriers are made of perforated metal sheet. This ensures good air permeability while maintaining high structural stability of the storage product carriers.

In an advantageous embodiment, the surface area of the openings is at least 5% of the surface of the bottom of the storage product carriers. This is to ensure that the air can flow uniformly in the vertical direction to a sufficient extent.

The conditioning apparatus advantageously has a particle filter formed for cleaning the air. By these means it is possible to clean the exhaust air extracted from the storage chamber of dusts and small particulate to keep the air clean.

In an advantageous embodiment, clean room conditions can be created in the storage chamber by means of the conditioning apparatus.

The conditioning apparatus can comprise a heating element allowing the air to be heated. This is necessary for storage product that must be stored at a predetermined minimum temperature.

Furthermore, the conditioning apparatus can have a cooling element allowing the air to be cooled. This has the advantage that storage product can also be stored for which the storage temperature must not exceed a maximum value.

The moisture of the air can be controllable by means of the conditioning apparatus.

In an advantageous embodiment, the storage chamber has sensors connected to the conditioning apparatus with the aid of which the ambient conditions in the storage chamber can be controlled. By providing such sensors a kind of air-conditioning system can be provided for the stored storage product.

To circulate the air, the conditioning unit can have a ventilation unit. Ventilation units with electrically driven motors can be easily and efficiently used to transport air.

The storage configuration can be formed as a circulating storage rack, wherein the transport apparatus transports the storage product carriers in a circulating manner.

Furthermore, the storage configuration can be formed as a vertical lift, wherein the transport apparatus delivers or withdraws the storage product carriers to and from the storage spaces provided in the storage chamber.

The invention will be described in more detail in the following with reference to exemplary embodiments schematically shown in the accompanying drawings, wherein:

FIG. 3 is a plan view of the storage chamber of FIG. 1;

FIG. 4 is a side elevational view of the storage configuration of FIG. 1 having a broken-away section of the outer wall;

Figure 1:
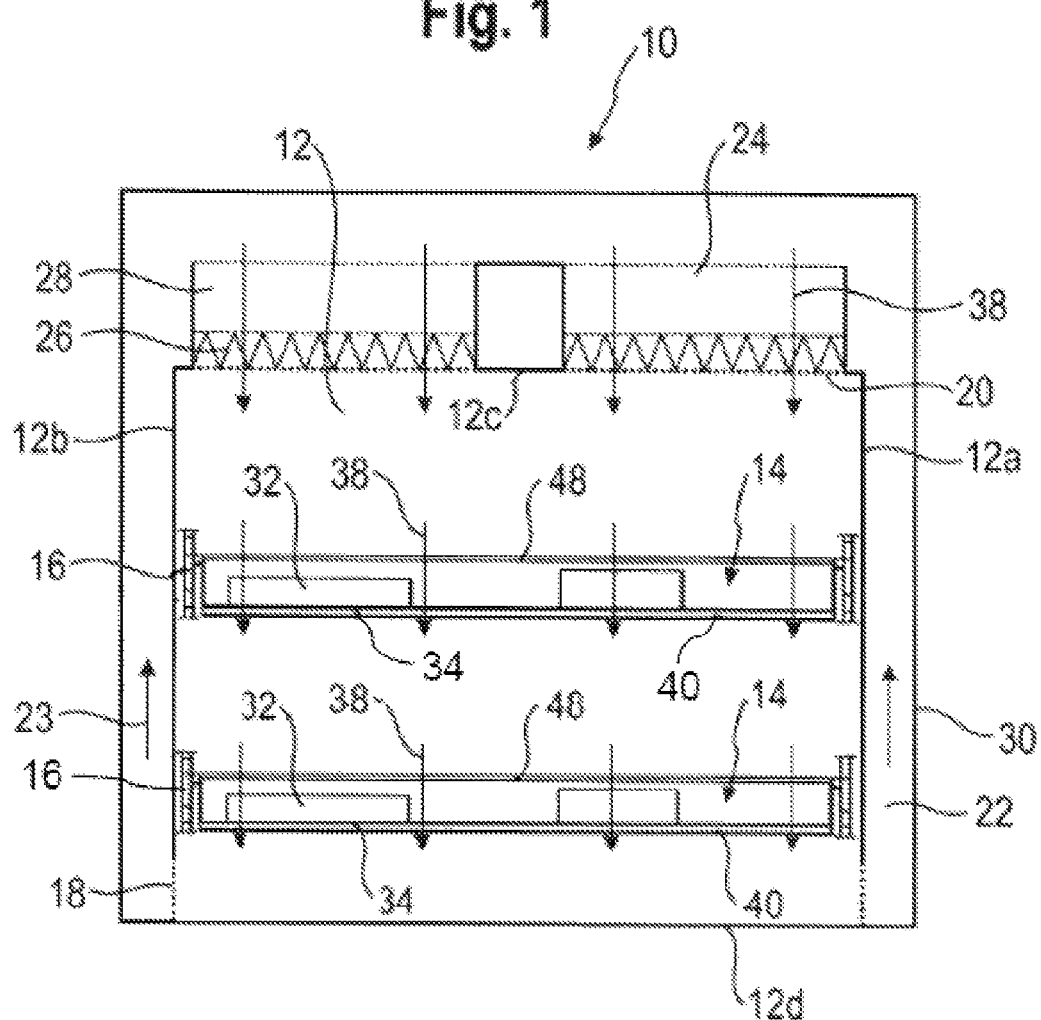
FIG. 1 is a cross-sectional view of a storage configuration according to a first embodiment of the present invention.

The first embodiment of storage configuration 10 shown in FIG. 1 comprises a storage chamber 12 with side walls 12a, 12b. A transport apparatus 16 is provided in the storage chamber for transporting storage product carriers 14. Storage chamber 12 is defined by a ceiling section 12c and a bottom section 12d.

In the vicinity of bottom section 12d, extraction openings 18 are formed in side walls 12a, 12b of storage chamber 12. Ceiling section 12c has injection openings 20.

Outside of storage chamber 12, exhaust air ducts 22 are provided along side walls 12a, 12b, through which exhaust air 23 is guided.

On the outside of ceiling section 12c of storage chamber 12, a conditioning means 24 is mounted on injection openings 20. Conditioning means 24 includes a particle filter 26 and a ventilation unit 28 connected to it. When ventilation unit 28 is energized, air 38 is transported in the vertical direction.

Alternatively, storage chamber 12 can have no ceiling section 12c and be open toward the top. In this case, conditioning means 24 is arranged at the ceiling opening of storage chamber 12.

The entire storage configuration 10 is surrounded by a housing 30 enclosing storage configuration 10 against the ambient atmosphere in an essentially airtight manner and defining exhaust ducts 22 together with side walls 12a, 12b of storage chamber 12.

Transport apparatus 16 is formed as a chain to which a plurality of storage product carriers 14 are attached in such a manner that they can be conveyed in a circulating manner like a paternoster.

Figure 2:
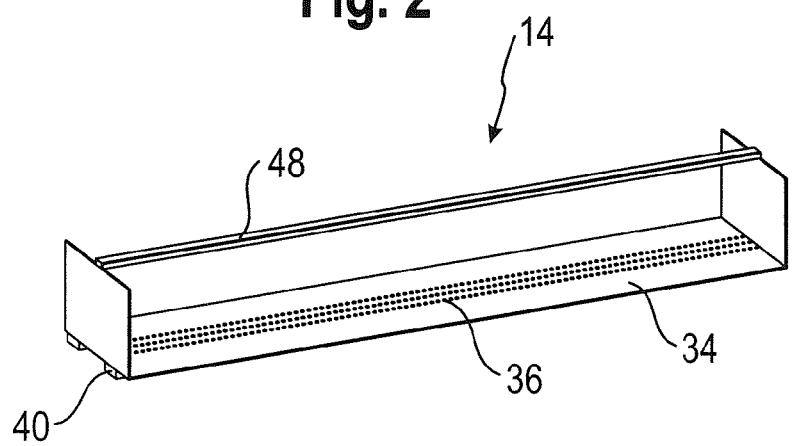
FIG. 2 shows a storage product carrier for use in the storage configuration of FIG. 1.

Storage product carriers 14 have a bottom 34, as can be seen from FIG. 2, on which storage product 32 can be deposited.

To allow a better flow of air 38 through storage product carrier 14, bottom 34 of storage product carrier 14 has openings 36, which are implemented by using a perforated metal sheet. Furthermore, storage product carrier 14 has no front or rear wall, which eases the flow of air 38 around storage product carrier 14.

To prevent openings 36 from negatively affecting the structural stability of storage product carrier 14, reinforcing elements 40 are provided on storage product carrier 14, which prevent bending of bottom 34 of storage product carrier 14. To further increase structural stability, storage product carrier 14 has a brace 48. Brace 48 can have the additional function of attaching storage product carrier 14 to transport apparatus 16.

To affect the structural stability of the storage configuration as little as possible, injection openings 20 are implemented, as shown in FIG. 3, as a perforated metal sheet having openings 20a. Openings 20a are only provided in the region in which air 38 is blown into storage chamber 12 by ventilation unit 28.

For the same reason, extraction openings 18 are implemented as perforated metal sheets having openings 18a, as can be seen in FIG. 4. Again, no openings 18a are provided in a region critical for structural stability.

To remove and store storage product 32, a feeding and removal opening 42 is provided, including a deposition table 44 and an operating rail 46. If storage product 32 is to be withdrawn from a storage product carrier 14 or to be stored in the same, storage product carrier 14 is traversed into feeding and removal opening 42 and can be operated by a user.

To ventilate storage chamber 12 and to create an atmosphere therein depleted of dust and particulate, air 38 is fed in a circuit through housing 30 and storage chamber 12.

Ventilation unit 28 blows air 38 through particle filter 26, which cleans air 38 of dust and particulate. Then air 38 flows through injection openings 20 into storage chamber 12 and flows through the latter in a vertical direction. The transported amount of air can be in the area of 1500 $m^3$/h. Depending on the size of the storage chamber 12 and the degree of repollution of air 38, the amount of air must be adapted to the conditions.

The vertical flow is facilitated by openings 36 in the bottoms of storage product carriers 14. Openings 36 thus allow a uniform vertical flow to be achieved in large parts of storage chamber 12.

As soon as air 38 reaches bottom section 12d, it is sucked out through extraction openings 18 from storage chamber 12 by means of the vacuum created on the suction side of ventilation unit 28 and is fed as exhaust air 23 through exhaust air duct 22 to ventilation unit 28 again.

By means of this air circuit, in which air 38 is cleaned of particles with each cycle, clean room conditions can be established in storage chamber 12. A positive pressure is established in storage chamber 12 to prevent dirt particles from entering.

The creation of clean room conditions is favored by the airflow not swirling up dust and particulate but feeding it in the direction of the force of gravity to the bottom. This means that all influences acting on releasable dust and particulate are directed toward the bottom section 12d, which results in the efficient extraction of dust and particulate with exhaust air 23 through extraction openings 18.

Storage configuration 10 is shown as a circulating storage rack in the first embodiment. However, the effects shown are also useable, in an identical manner, in a vertical lift.

Figure 5:
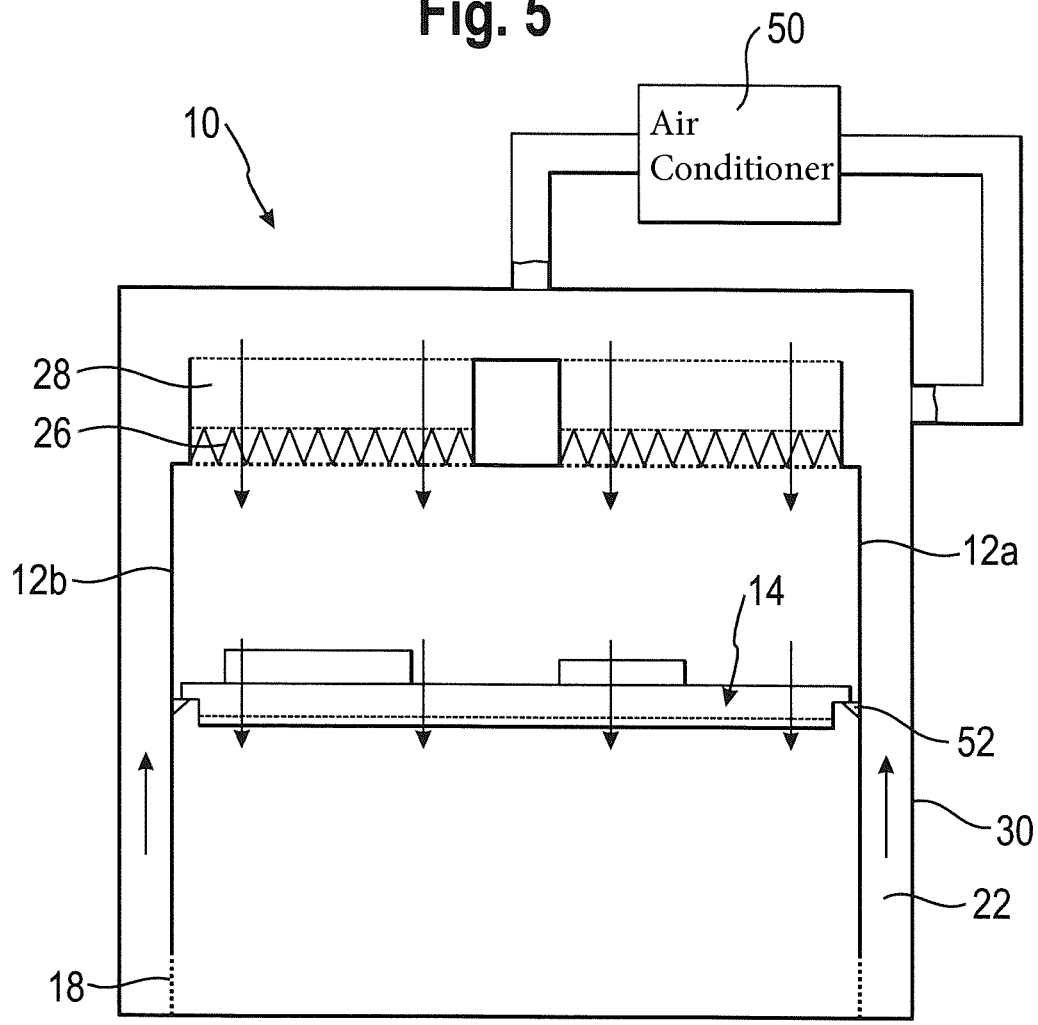
FIG. 5 shows a storage configuration according to a second embodiment of the present invention.

FIG. 5 shows a second embodiment configured as a vertical lift. Herein, a plurality of supports 52 to receive storage product carriers 14, which can be conveyed by means of a transport apparatus, are provided on the side walls 12a, 12b of storage chamber 12.

Figure 6:
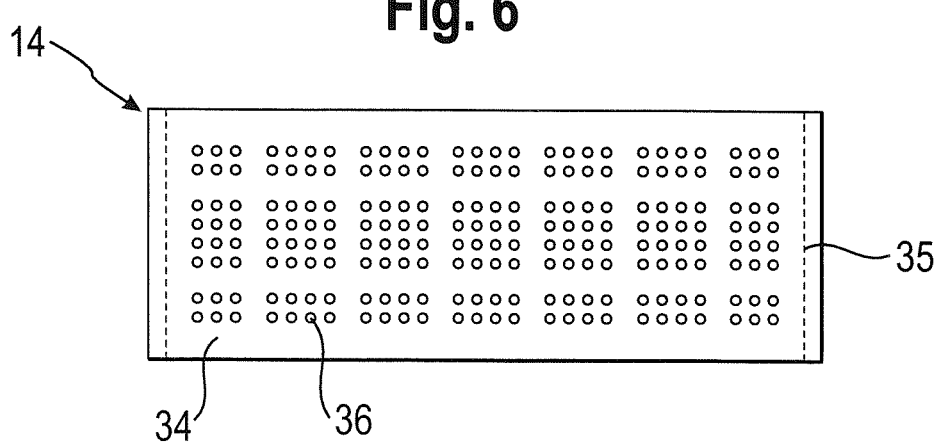
FIG. 6 is a plan view of a storage product carrier for the storage configuration of FIG. 5.

Such a storage product carrier 14, as it is shown in FIG. 6, also has openings 36 in its bottom 34, to enable the vertical flow of air 38 in storage chamber 12. Storage product carriers 14 have guiding steps 35 at their end faces for guiding storage product carriers 14 on supports 52.

Storage configuration 10 can be equipped with further units in addition to a ventilation unit 28 and a particle filter 26.

In the second embodiment of storage configuration 10, as shown in FIG. 5, an air-conditioning unit 50 is provided, by means of which the temperature in storage chamber 12 can be open- or closed-loop controlled.

The air-conditioning apparatus 50 is arranged in the region of exhaust air duct 22 to keep the effect of dust and particulate introduction as small as possible.

Further units, such as air moisteners, air dryers or apparatuses to create a protective atmosphere can of course also be used in storage configuration 10.

Such units can be integrated in exhaust air duct 22 to ensure that all exhaust air 23 is conditioned by the units.

It is also possible to install the conditioning apparatus 24 and the air-conditioning apparatus 50 and further units separate from storage configuration 10 and to connect them using suitable air duct means, such as hoses, with exhaust air ducts 22 and injection openings 20.

Both in the circulating storage rack and the vertical lift, the units, conditioning and air-conditioning apparatuses can be freely combined.

Openings 18a, 20a, 36 can have any desired form, in particular can be circular, oval-shaped or rectangular.

The storage configuration 10 according to the present invention improves the clean room capability of a storage chamber 12 with respect to the prior art by means of its vertical airflow, which directs dust and particulate in a focused manner to an extraction opening 18.

LIST OF REFERENCE SIGNS

10 storage configuration
12 storage chamber
12a side wall
12b side wall
12c ceiling section
12d bottom section
14 storage product carrier
16 transport apparatus
18 extraction opening
18a opening
20 injection openings
20a opening
22 exhaust air duct
23 exhaust air
24 conditioning means
26 particle filter
28 ventilation unit
30 housing
32 storage product
34 bottom
35 guiding step
36 opening
38 air
40 reinforcing element
42 feeding and removal opening
44 deposition table
46 operating rail
48 brace
50 air-conditioning apparatus
52 support

The invention claimed is:

1. A storage configuration with a storage and retrieval system and a predeterminable storage atmosphere, comprising;
   a plurality of flat air permeable product carriers each extending between opposite ends, being open at the top, and having a bottom with openings through which air can flow and on which product can be deposited;
   a storage chamber forming an enclosure isolatable from its surrounding environment including a pair of side walls, an opening through which the product can be fed and removed from the storage chamber, and a plurality of vertically displaced storage locations at which the product carriers are stored;
   a transport apparatus for supporting and vertically transporting the product carriers between the vertically displaced storage locations at which the product carriers extend across the storage chamber such that the opposite ends of the product carriers are located proximate to the side walls of the storage chamber;
   the storage chamber including an air extraction opening adjacent to a bottom section of the storage chamber and an air injection opening adjacent to a top section of the storage chamber;
   an exhaust air duct connected to the air extraction opening;
   a conditioning apparatus interconnecting the exhaust air duct and the air injection opening for exhausting the air from the bottom section of the storage chamber via the air extraction opening, treating it and injecting it back into the top section of the storage chamber via the air injection opening, so that the air flows through the storage chamber in a vertical direction from the top section to the bottom section along a pathway that proceeds from the conditioning apparatus through the air injection opening into the top section of the storage chamber through the bottom openings of the product carriers in the vertically displaced storage locations in the same vertical direction and out the bottom section of the storage chamber through the air extraction opening and along the exhaust air duct for returning to the conditioning apparatus.

2. The storage configuration according to claim 1, characterized in that at least one of the injection opening and the extraction opening are configured as a perforated metal sheet.

3. The storage configuration according to claim 1, characterized in that the air extraction opening is provided in a lower region of the side walls of the storage chamber.

4. The storage configuration according to claim 1 in which the bottoms of the product carriers comprise a perforated metal sheet.

5. The storage configuration according to claim 1, characterized in that the surface area of the openings is at least 5% of the surface of the bottom of the product carriers.

6. The storage configuration according to claim 1, characterized in that the conditioning apparatus includes a particle filter to clean the air.

7. The storage configuration according to claim 4, characterized in that the conditioning apparatus cleans dusts and small particulate from the air exhausted from the storage chamber.

8. The storage configuration according to claim 1, characterized in that the conditioning apparatus provides for heating the air.

9. The storage configuration according to claim 1, characterized in that the conditioning apparatus provides for cooling the air.

10. The storage configuration according to claim 1, characterized in that the conditioning apparatus provides for controlling a moisture content of the air.

11. The storage configuration according to claim 1, characterized in that the conditioning apparatus in the storage chamber is closed-loop controlled.

12. The storage configuration according to claim 1, characterized in that the conditioning apparatus includes a ventilation unit to circulate the air.

13. The storage configuration according to claim 1, wherein the transport apparatus conveys the product carriers within the storage chamber in a vertically circulating manner through positions at which the opposite ends of the product carriers are located proximate to the side walls of the storage chamber.

14. The storage configuration according to claim 1 in which the storage chamber is enclosed by a housing, and the exhaust air duct is formed between the side walls of the storage chamber and the housing.

15. The storage configuration according to claim 13, wherein the pathway along which the air flows in the vertical direction from the top section of the storage chamber to the bottom section of the storage chamber traverses through the bottom openings of the product carriers that are attached for movement in the vertically circulating manner.

16. The storage configuration according to claim 15, wherein the transport apparatus is formed as a chain to which the plurality of product carriers are attached for movement in the vertically circulating manner within the storage chamber.

17. The storage configuration according to claim 16, wherein the attached product carriers have a brace extending between the opposite ends of the attached product carriers, and the attached product carriers are attached to the to the transport apparatus through the brace.

18. The storage configuration according claim 1, wherein the transport apparatus conveys the product carriers in the vertical direction and feeds and withdraws the product carriers to and from storage spaces.

19. The storage configuration according to claim 18, wherein the opening in the storage chamber is arranged for receiving the plurality of flat air permeable product carriers such that the product carriers can be delivered individually through the opening in the storage chamber for the storage and removal of the product that is deposited on the product carriers.

20. The storage configuration according to claim 19, wherein supports are provided on the side walls of the storage chamber for supporting the product carriers in the vertically displaced storage locations, and the product carriers include guiding steps at the opposite ends of the product carriers for guiding the product carriers onto the supports on the side walls of the storage chamber.

21. The storage configuration according to claim 1 in which the attached product carriers have no front or rear wall to ease the flow of the air around the product.

22. The storage configuration according to claim 21, wherein the openings in the bottoms of the attached product carriers are arranged to support a uniform vertical flow through the storage chamber.

* * * * *